(12) United States Patent
Raghuram et al.

(10) Patent No.: US 7,307,013 B2
(45) Date of Patent: Dec. 11, 2007

(54) NONSELECTIVE UNPATTERNED ETCHBACK TO EXPOSE BURIED PATTERNED FEATURES

(75) Inventors: Usha Raghuram, San Jose, CA (US); Michael W. Konevecki, San Jose, CA (US); Samuel V. Dunton, San Jose, CA (US)

(73) Assignee: Sandisk 3D LLC, Sunnyvale, CA (US)

( * ) Notice: Subject to any disclaimer, the term of this patent is extended or adjusted under 35 U.S.C. 154(b) by 120 days.

(21) Appl. No.: 10/883,417

(22) Filed: Jun. 30, 2004

(65) Prior Publication Data

US 2006/0003586 A1    Jan. 5, 2006

(51) Int. Cl.
    *H01L 21/461*    (2006.01)
    *C03C 25/68*     (2006.01)
    *C23F 1/00*      (2006.01)

(52) U.S. Cl. .................... 438/626; 216/38; 216/72

(58) Field of Classification Search ............... 438/626, 438/692; 216/38, 67, 72
    See application file for complete search history.

(56) References Cited

U.S. PATENT DOCUMENTS

| | | | | |
|---|---|---|---|---|
| 4,670,091 A | * | 6/1987 | Thomas et al. | 438/626 |
| 4,767,724 A | * | 8/1988 | Kim et al. | 438/620 |
| 5,017,403 A | * | 5/1991 | Pang et al. | 427/576 |
| 5,234,860 A | * | 8/1993 | Gluck | 438/67 |
| 5,294,294 A | * | 3/1994 | Namose | 438/699 |
| 5,296,092 A | * | 3/1994 | Kim | 438/699 |
| 5,631,197 A | * | 5/1997 | Yu et al. | 438/699 |
| 5,639,345 A | * | 6/1997 | Huang et al. | 438/699 |
| 5,679,211 A | * | 10/1997 | Huang | 438/697 |
| 5,773,367 A | * | 6/1998 | Jen | 438/734 |
| 6,045,435 A | * | 4/2000 | Bajaj et al. | 451/41 |
| 6,117,798 A | * | 9/2000 | Fang et al. | 438/782 |
| 6,127,070 A | * | 10/2000 | Yang et al. | 430/5 |
| 6,143,664 A | * | 11/2000 | Yao et al. | 438/692 |
| 6,248,667 B1 | * | 6/2001 | Kim et al. | 438/690 |
| 6,251,783 B1 | * | 6/2001 | Yew et al. | 438/692 |
| 6,258,712 B1 | * | 7/2001 | Wang | 438/634 |
| 6,268,263 B1 | * | 7/2001 | Sakai et al. | 438/424 |
| 6,350,694 B1 | | 2/2002 | Chang et al. | |
| 6,380,068 B2 | * | 4/2002 | Jeng et al. | 438/626 |
| 6,509,270 B1 | * | 1/2003 | Held | 438/691 |
| 6,511,888 B1 | | 1/2003 | Park et al. | |
| 6,600,229 B2 | * | 7/2003 | Mukherjee et al. | 257/762 |
| 6,774,041 B1 | * | 8/2004 | Kondo et al. | 438/692 |
| 6,864,177 B2 | * | 3/2005 | Jung et al. | 438/692 |
| 6,913,703 B2 | * | 7/2005 | Strang et al. | 216/13 |
| 6,939,796 B2 | * | 9/2005 | Lohokare et al. | 438/626 |
| 6,987,064 B2 | * | 1/2006 | Chuang et al. | 438/692 |
| 2003/0104691 A1 | * | 6/2003 | Blalock et al. | 438/626 |
| 2005/0009322 A1 | * | 1/2005 | Matsui et al. | 438/633 |
| 2005/0202670 A1 | * | 9/2005 | Shinmaru et al. | 438/626 |

* cited by examiner

*Primary Examiner*—M. Wilczewski
(74) *Attorney, Agent, or Firm*—Eschweiler & Associates, LLC

(57) ABSTRACT

A method for etching to form a planarized surface is disclosed. Spaced-apart features are formed of a first material, the first material either conductive or insulating. A second material is deposited over and between the first material. The second material is either insulating or conductive, opposite the conductivity of the first material. The second material is preferably self-planarizing during deposition. An unpatterned etch is performed to etch the second material and expose the top of the buried features of the first material. The etch is preferably a two-stage etch: The first stage is selective to the second material. When the second material is exposed, the etch chemistry is changed such that the etch is nonselective, etching the first material and the second material at substantially the same rate until the buried features are exposed across the wafer, producing a substantially planar surface.

91 Claims, 14 Drawing Sheets

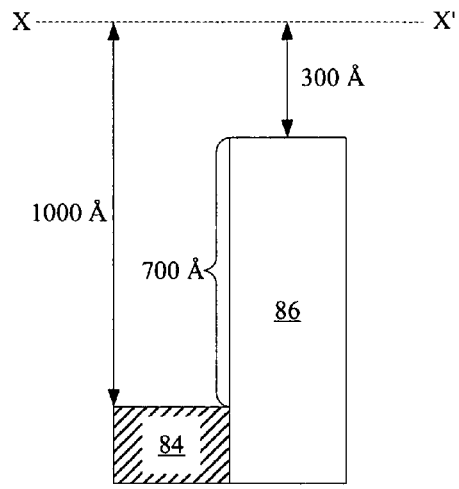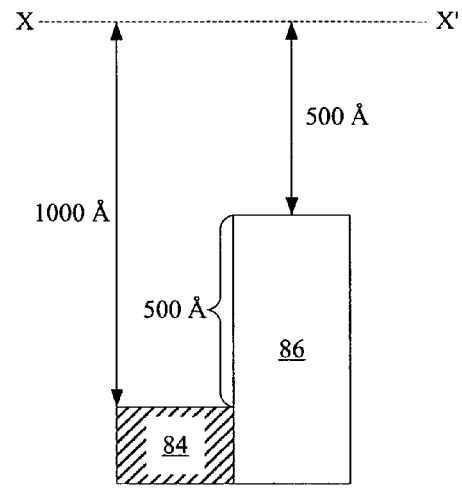
Before HF dip
Fig. 9a
After HF dip
Fig. 9b
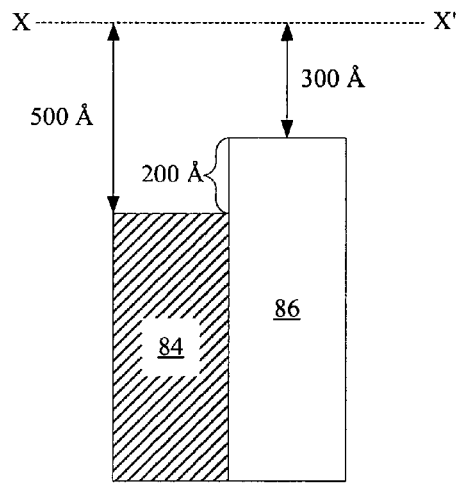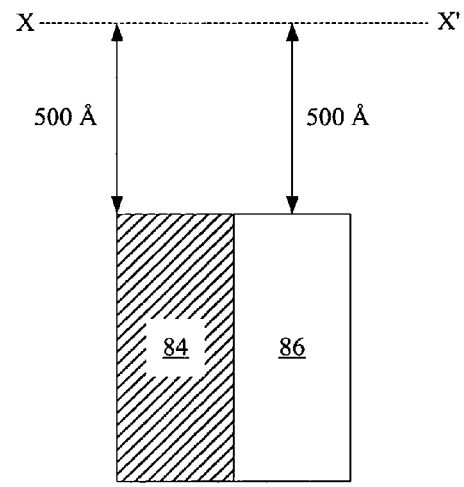
Before HF dip
Fig. 9c
After HF dip
Fig. 9d Before HF dip After HF dip Before HF dip After HF dip

NONSELECTIVE UNPATTERNED ETCHBACK TO EXPOSE BURIED PATTERNED FEATURES

BACKGROUND OF THE INVENTION

The invention relates to a method to etch a deposited material to expose buried features, wherein the etched surface is substantially planar. A minimal step or no step may be created between the exposed features and the deposited material.

In the fabrication of semiconductor devices on a wafer, there are times when a surface must be as planar as possible. This need frequently arises, for example, during the fabrication of monolithic three dimensional memory arrays, in which multiple memory levels are formed, each level constructed on top of previously formed memory levels. When constructing monolithic three dimensional memory arrays, it has become usual to perform such planarization using chemical mechanical planarization (CMP).

CMP has significant disadvantages, however. Compared to etchback, CMP is relatively expensive and slow, it can leave behind slurry defects on the polished surface, and CMP endpoint detection is relatively imprecise.

There is a need, therefore, to improve planarization methods.

SUMMARY OF THE INVENTION

The present invention is defined by the following claims, and nothing in this section should be taken as a limitation on those claims. In general, the invention is directed to a method to etch a deposited material to expose buried features, wherein after etch the etched surface is substantially planar with a minimal step or no step created between the exposed features and the deposited material.

A first embodiment of the invention provides for a method for exposing buried features on a wafer, the method comprising forming the features comprising a first a) conducting or semiconducting material or b) insulating material; depositing a second a) insulating material or b) conducting or semiconducting material to cover the first material, the insulating or conducting property of the second material opposite the first material; and substantially nonselectively etching both the second material and the first material, wherein etch selectivity of the second material to the first material during this nonselective etching step is between about 0.3 and 6.

Another embodiment of the invention provides for a method for planarizing a wafer surface, the method comprising forming silicon features; depositing a dielectric material over and between the silicon features; and substantially nonselectively etching both the dielectric material and a portion of the silicon features to expose the silicon features, wherein during the nonselective etch step, the etch selectivity of the dielectric material to silicon is between about 0.3 and about 4.

A related embodiment of the invention provides for a method for planarizing a wafer surface, the method comprising forming features of metal or a conductive alloy; depositing a dielectric material over and between the features; and substantially nonselectively etching both the dielectric material and a portion of the features to expose the features, wherein, during the nonselective etching step, the etch rate of dielectric to metal or the conductive alloy is between about 0.6 and about 6.

Yet another embodiment of the invention provides for a planarized surface in a semiconductor device comprising a plurality of spaced-apart, substantially parallel rails of conductive material separated by gaps, each rail having a top surface; and a plurality of spaced-apart, substantially parallel strips of dielectric material filling the gaps, each strip having a top surface; and a covering material over and in contact with both the rails and the dielectric material, wherein a vertical step between the top surface of one of the rails and the top surface of the adjacent strip of dielectric material nowhere exceeds about 500 angstroms, and wherein no CMP step was performed on the conductive material after formation of the plurality of rails and the plurality of strips and before formation of the covering material.

An aspect of the invention provides for a planarized wafer surface comprising a plurality of spaced-apart polysilicon diodes separated by gaps, the diodes having a first substantially planar top surface; a dielectric material filling the gaps, the dielectric material having a second substantially planar top surface; and a covering material on the polysilicon diodes and on and in contact with the dielectric material, wherein the vertical step between the top of the diodes and the top surface of the dielectric material nowhere exceeds about 500 angstroms, and wherein no CMP step was performed on the first planar top surface of the polysilicon diodes after formation of the plurality of diodes and the dielectric material and before formation of the covering material.

Another aspect of the invention provides for a method for planarizing a surface, the method comprising forming features of a conductive or semiconductive material; covering the features with a dielectric material; performing a first etch of the dielectric material, the first etch having first process conditions; stopping the first etch substantially when the conductive or semiconductive material is first exposed; and performing a second etch of both the conductive or semiconductive material and the dielectric material, the second etch having second process conditions different from the first process conditions.

Each of the aspects and embodiments of the invention can be used alone or in combination with one another.

The preferred aspects and embodiments will now be described with reference to the attached drawings.

BRIEF DESCRIPTION OF THE DRAWINGS

FIGS. 9a-9h are cross-sectional views illustrating results produced using different etch selectivities during a relatively nonselective oxide/polysilicon etch.

DETAILED DESCRIPTION OF THE PREFERRED EMBODIMENTS

Figure 1A:
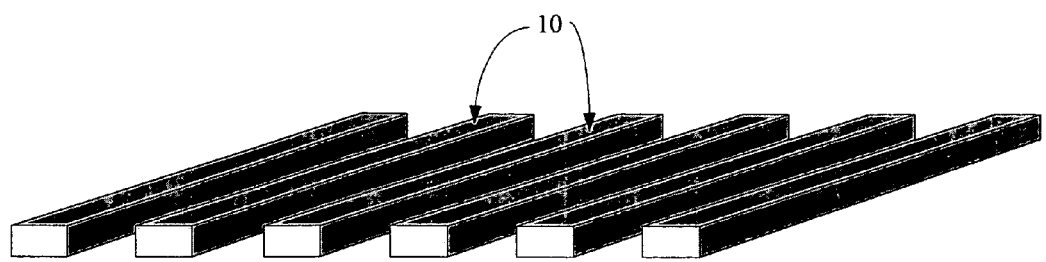
FIG. 1a is a perspective view of parallel, spaced-apart rail-type features.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Lee et al., U.S. patent application Ser. No. 09/927,648, "Dense Arrays and Charge Storage Devices, and Methods for Making Same," filed Aug. 13, 2001; Herner, U.S. application Ser. No. 10/095,962, "Silicide-Silicon Oxide-Semiconductor Antifuse Device and Method of Making," filed Mar. 13, 2002; Vyvoda et al., U.S. patent application Ser. No. 10/185,507, "Electrically Isolated Pillars in Active Devices," filed Jun. 27, 2002; Walker et al., U.S. application Ser. No. 10/335,089, "Method for Fabricating Programmable Memory Array Structures Incorporating Series-Connected Transistor Strings," filed Dec. 31, 2002; Scheuerlein et al., U.S. application Ser. No. 10/335,078, "Programmable Memory Array Structure Incorporating Series-Connected Transistor Strings and Methods for Fabrication and Operation of Same," filed Dec. 31, 2002; Vyvoda, U.S. patent application Ser. No. 10/440,882, "Rail Schottky Device and Method of Making", filed May 19, 2003; Herner et al., U.S. patent application Ser. No. 10/326,470, "An Improved Method for Making High Density Nonvolatile Memory," filed Dec. 19, 2002 and hereinafter the '470 application; Cleeves et al., U.S. patent application Ser. No. 10/728,437, "Optimization of Critical Dimensions and Pitch of Patterned Features in and Above a Substrate," filed Dec. 5, 2003; and Petti et al., U.S. patent application Ser. No. 10/728,230, "Semiconductor Device Including Junction Diode Contacting Contact-Antifuse Unit Comprising Silicide," filed Dec. 3, 2003, all assigned to the assignee of the present invention and hereby incorporated by reference.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The term "monolithic" means that layers of each level of the array were directly deposited on the layers of each underlying level of the array. In contrast, two dimensional arrays may be formed separately and then packaged together to form a non-monolithic memory device.

Many conventional processes used in formation of semiconductor devices, such as photolithography and etch, become more difficult to perform over preexisting topography. During exposure of photoresist, for example, optimal resolution can be achieved only within a limited depth of focus. Thus maximizing planarity is important.

Figure 1B:
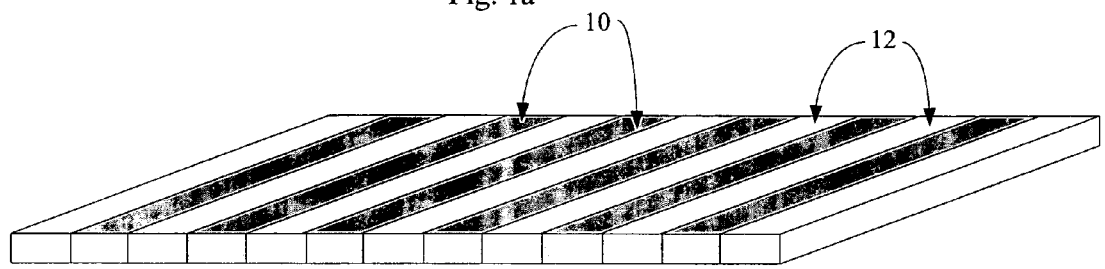
FIG. 1b shows the same features after the gaps between them have been filled, and the fill planarized to expose the tops of the features and create a planarized surface.
Figure 2A:
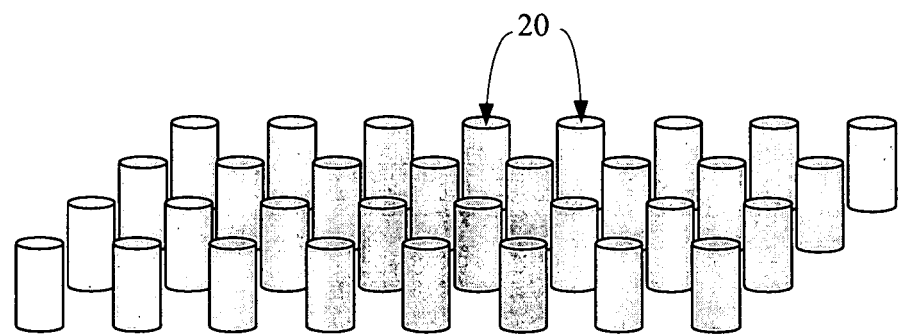
FIG. 2a is a perspective view of spaced-apart vertical diodes.
Figure 2B:
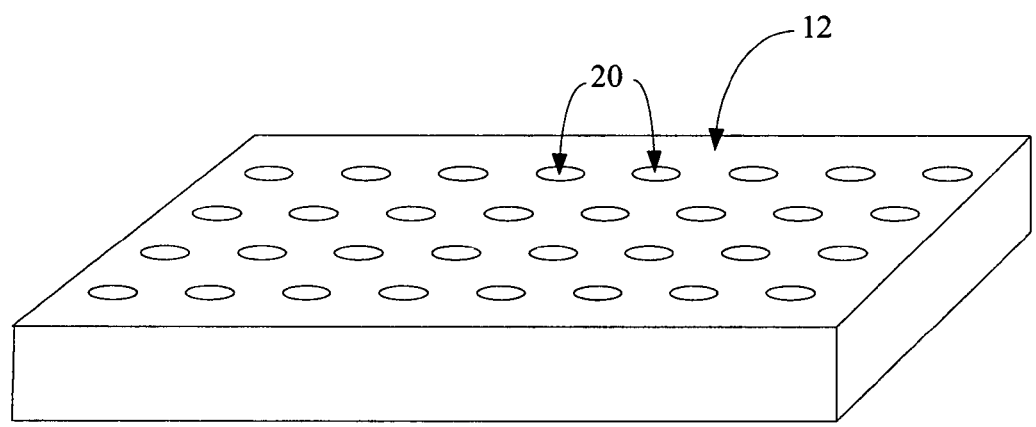
FIG. 2b shows the same diodes after the gaps between them have been filled, and the fill planarized to expose the tops of the diodes and create a planarized surface.

A particularly difficult planarizing task is encountered during formation of monolithic three dimensional memory arrays. In the incorporated references, it is usual to form active features separated by gaps. Such active features can be, for example, a plurality of substantially parallel, substantially coplanar conductors or railstacks 10 like those shown in FIG. 1a (and described in Johnson et al., U.S. Pat. No. 6,034,882, inter alia), or vertically oriented semiconductor diodes 20 in the shape of pillars as shown in FIG. 2a and described in the '470 application, inter alia. The gaps between the features are filled with dielectric 12, shown in FIGS. 1b and 2b, covering the features. The fill must then be removed to expose the tops of the active features, leaving a relatively planar surface as shown FIGS. 1b and 2b.

Figure 3:
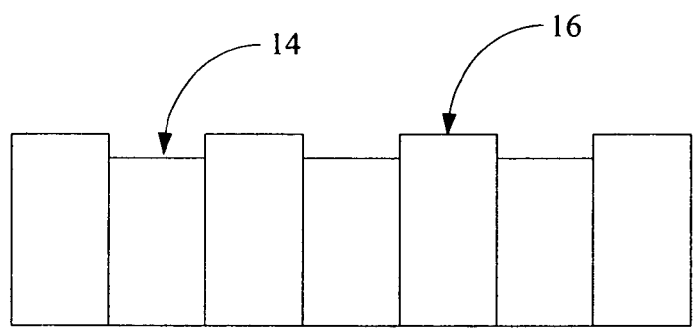
FIG. 3 is a cross section illustrating recessed oxide between active features after a selective etch.

CMP has frequently been used to expose the active features and leave a planarized surface. As described earlier, CMP has many disadvantages, including that, in the case of exposed diodes like those in FIG. 2b, a significant amount of diode material is removed, and there may be large variations in the amount of material removed across the wafer, causing nonuniformities in device behavior. Etchback, used as an alternative to CMP, has the disadvantage that, using conventional etch processes, the dielectric (typically oxide) and the material forming the features covered by the dielectric (in, for example, the '470 application, conductors are typically formed of metal, conductive nitride, silicide, or some other conductive alloy, while pillars are typically formed of silicon, though other semiconductor materials or alloys may be used) will not etch at the same rate. Turning to FIG. 3, if, for example, oxide 14 is etched using typical etchants, when features 16 of, for example, tungsten or silicon are exposed, those exposed features will etch more slowly than the oxide, causing the oxide to be recessed. The figure is shown in cross-section. As described earlier, the topography created by this recess makes subsequent fabrication over this surface more difficult.

The present invention is a method to perform an unpatterned etchback to expose buried features of a first material interspersed with a second material while producing a minimal or no vertical step between the first and second materials and while maintaining planarity. The present invention will first be described in general terms, then detailed examples will be provided.

In general, according to the present invention, patterned features of a first material are formed. The first material may be conductive (such as a metal, a conductive alloy, or a doped semiconductor) or may be a dielectric. A second material, which may be dielectric or conductive, will be deposited over and between the patterned features. In preferred embodiments of the invention, the first material is conductive and the second material is dielectric. In other embodiments, the first material is a semiconductor material, for example silicon, which may either be doped or undoped. In other embodiments, the first material is dielectric and the second material is conductive or semiconductive. For simplicity, this example will describe a conductive first material and a deposited dielectric second material, though other materials may be used.

Figure 4A:
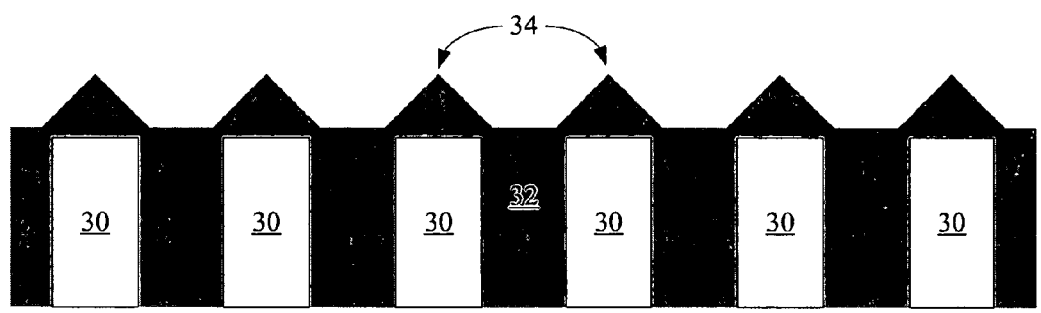
FIGS. 4a and 4b are cross-sections illustrating how a self-planarizing fill such as HDP oxide initially reproduces underlying topography during deposition, then tends to self-planarize.
Figure 4B:
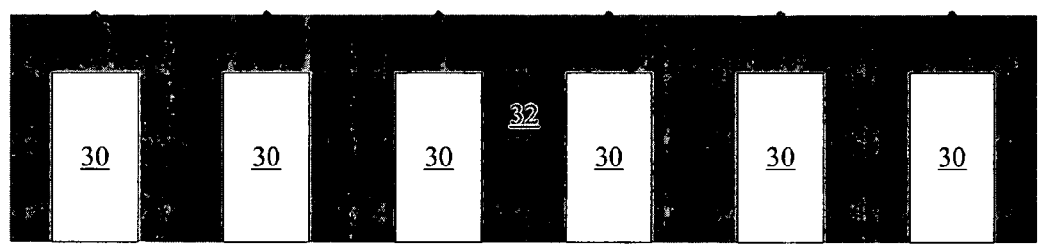

The second material preferably has the characteristic of being self-planarizing during deposition. An example of such a self-planarizing dielectric material is HDP dielectric, for example HDP oxide. As shown in FIG. 4a, when deposited over patterned features 30, HDP oxide layer 32 initially reproduces underlying topography, forming peaks 34. With continued deposition, however, peaks 34 are knocked off and topography gradually evens out, as in FIG. 4b. Preferably the second material is overfilled to maximize planarity. Other suitable materials having this self-planarizing characteristic are spin-on polymer and spin-on dielectric, including spin-on glass. Alternatively, in a less-preferred embodiment, a second material that is not self-planarizing can be used, then subjected to CMP to planarize it. This CMP step is used to planarize the second material only, and is stopped well before the buried patterned features are exposed.

Next an etch is performed. This etch is preferably an unpatterned etch, in which all or most of the wafer surface is exposed to the etch step, and the purpose of the etch is to expose buried features while maintaining planarity. This is in contrast to a patterning etch, in which portions of the wafer surface are covered by photoresist, and the purpose of the etch step is to create patterned features. The etch step is preferably a dry etch, such as a plasma etch. An unpatterned etchback step generally maintains topography; i.e. an initially planar surface will remain substantially planar during the etch.

The etch is preferably a two-stage etch. In the first stage the second material only is etched, and preferably etch conditions are selected for efficient etch of the second material. When the patterned features formed of the first material are exposed, the etch is stopped. This can be achieved by detecting the change in chemical byproducts that takes place when the patterned features of the first material are reached, then stopping the etch by, for example, cutting plasma power or interrupting gas flow. The etch can be stopped almost instantaneously. Next, the second stage of the two-stage etch begins. In this stage, etch conditions are chosen to be as nonselective as possible, and thus to etch both the first material and second material at as close as possible to the same rate so that a minimal vertical step or no vertical step is produced between them. The second etch typically removes less material than the first, and thus preferably proceeds more slowly so that it can be more easily controlled.

Deposition and etch are generally not uniform across a wafer; for example, deposition is usually faster in the center of the wafer than at the edges, or vice versa. Thus at first exposure of the patterned features by the first-stage, selective etch, most likely not all of the patterned features are exposed simultaneously. The second-stage, nonselective etch, which etches both the covering material and the patterned features, continues until all of the patterned features are exposed.

The embodiment just described includes a two-stage etch in which the first stage is selective to etch the second material as quickly as possible, while the second stage is nonselective to etch both the first and second materials together. Such a two-stage process is preferred because the first stage, when only the second material is being etched, proceeds quickly. Inclusion of this first stage is preferable, but only the second, non-selective etch stage is really essential. If desired, the entire etch can be nonselective.

It is also possible, and within the scope of the invention, to include a CMP step after the deposition of the second material and before the nonselective etch to produce an initially planar surface, but this adds process complexity and is not preferred.

To summarize, aspects of the preferred embodiments provide for a method for planarizing a surface, the method comprising forming features of a conductive or semiconductive material; covering the features with a dielectric material; performing a first etch of the dielectric material, the first etch having first process conditions; stopping the first etch substantially when the conductive or semiconductive material is first exposed; and performing a second etch of both the conductive or semiconductive material and the dielectric material, the second etch having second process conditions different from the first process conditions. The term process conditions refers to the conditions during a process such as an etch. Aspects of process conditions that may be changed include pressure, temperature, plasma power, presence of gases and amount of those gases flowed.

Detailed examples will be now given of unpatterned etchback to expose patterned features performed according to the present invention. For clarity, these examples include details regarding materials, steps, and processing conditions. It will be understood, however, that these examples are intended to be nonlimiting, and that many of the materials, processing conditions, and steps can be changed, supplemented, or omitted while the results fall within the scope of the invention.

The monolithic three dimensional memory array taught in the '470 application includes features that can advantageously be filled and exposed using methods according to the present invention. Two examples will be given.

EXAMPLE

Etch Oxide to Expose Tungsten

Figure 5:
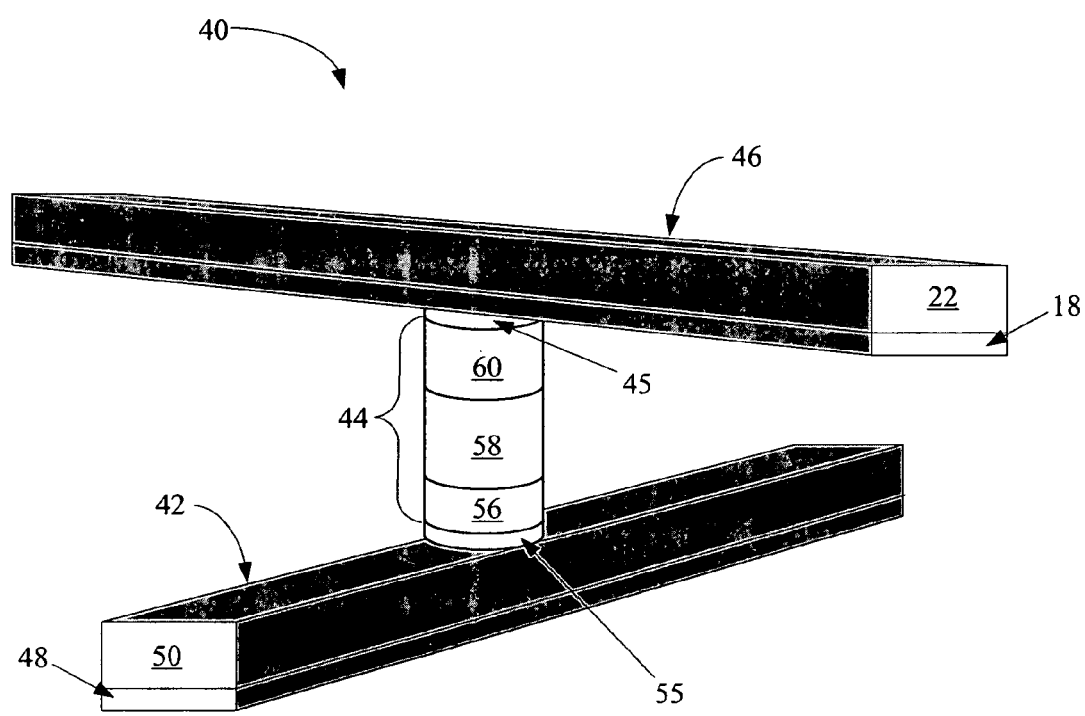
FIG. 5 is a perspective view of a prior art memory cell which the methods of the present invention can advantageously be used to fabricate.

The '470 application teaches a memory cell 40 like the one shown in FIG. 5. Various embodiments are possible, but in the example shown, a vertically oriented diode 44 is disposed between a bottom conductor 42 and a top conductor 46. Diode 44 is separated from top conductor 46 by an antifuse 45. When antifuse 45 is in its original intact state, no current flows between top conductor 46 and bottom conductor 42, and memory cell 40 is unprogrammed. When antifuse 45 is ruptured, current flows between the conductors, and the cell 40 is programmed. Detail regarding the formation of a monolithic three dimensional memory array including memory cell 40 is provided in the '470 application. Portions of the formation of such a cell are provided here to describe use of the present invention in forming such a cell. The description of the formation of the memory cells and array of the '470 application provided here, however, is simplified for clarity, and is not intended to be exhaustive. Specifically, no teaching of the '470 application is intended to be excluded.

Figure 6A:
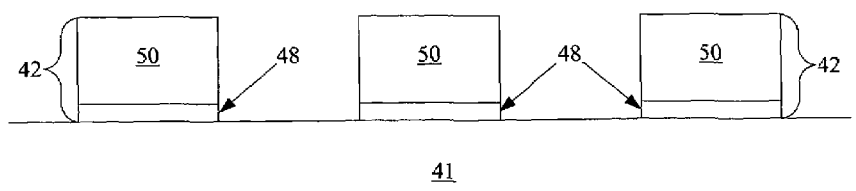
FIGS. 6a-6h are cross-sectional views illustrating fabrication of an array of the memory cell of FIG. 5 with planarization performed according to the present invention.

Turning to FIG. 6a, formation of a memory level comprising cells like the one shown in FIG. 5 begins on a dielectric layer 41. This dielectric layer can be formed directly over a semiconductor substrate such as a monocrystalline wafer or an SOI substrate, or may be formed over a previously formed device level. To form bottom conductors 42, an adhesion layer 48, preferably titanium nitride, is deposited, followed by a conductive layer 50, preferably tungsten. This is optionally followed by deposition of a barrier layer (not shown), preferably of titanium nitride, though other materials, including other conductive nitrides or conductive alloys, may be used. The barrier layer can be deposited and etched either during formation of bottom conductor 42, or during formation of overlying diode 44. Next layers 48 and 50 (and the barrier layer if present) are etched to form bottom conductors 42 using standard photolithography techniques. FIG. 6*a* shows the resulting structure at this point. Bottom conductors are preferably between about 1000 angstroms and about 2000 angstroms thick, preferably about 1500 angstroms thick.

Figure 6B:
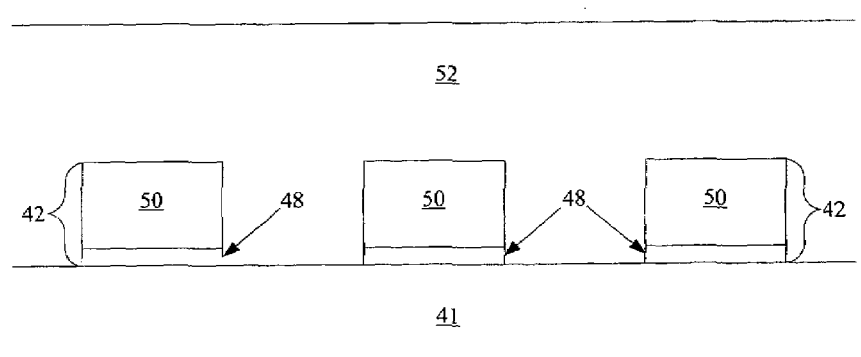

Next, as shown in FIG. 6*b*, dielectric material 52, for example HDP oxide, is deposited over and between bottom conductors 42, filling the gaps between them. Dielectric material 52 preferably tends to be self-planarizing, and is overfilled to maximize planarity, as shown, to a thickness of between about 2500 and about 1500 angstroms, preferably about 2000 angstroms. Alternatively, in less preferred embodiments, dielectric material 52 can be non-planar as deposited, and planarized in a CMP step which stops before any portion of the conductors 42 are exposed.

Once dielectric material 52 is substantially planar, an etch is performed to remove the overfill of dielectric material 52 and expose the top surface of bottom conductors 42. For example, if dielectric material 52 is HDP oxide, the etch is preferably performed in an appropriate chamber, for example an Applied Materials Centura MxP. In preferred embodiments, during the first stage etch, plasma power is about 700 watts, pressure is about 200 mTorr, and the gases flowed are 60 standard cubic centimeters/minute (sccm) of $CHF_3$, 20 sccm of $CF_4$, 100 sccm of Ar, 10 sccm of $N_2$, and 10 sccm of $SF_6$.

It was noted that a barrier layer, preferably of titanium nitride (also optionally of tungsten nitride, tantalum nitride, or other materials), separates the metal of the conductors (preferably tungsten) from the semiconductor material of the pillar to be formed above the conductor, and that this barrier layer can either be formed as the top layer of the conductor or as the bottom layer of the pillar. For simplicity, this description will assume the barrier layer is being formed with the pillar. In this example, it will be assumed that the top of the conductors is tungsten. It will be understood, however, that in other embodiments a barrier layer could be present at the top of conductors 42, or that other materials could be used.

Figure 6C:
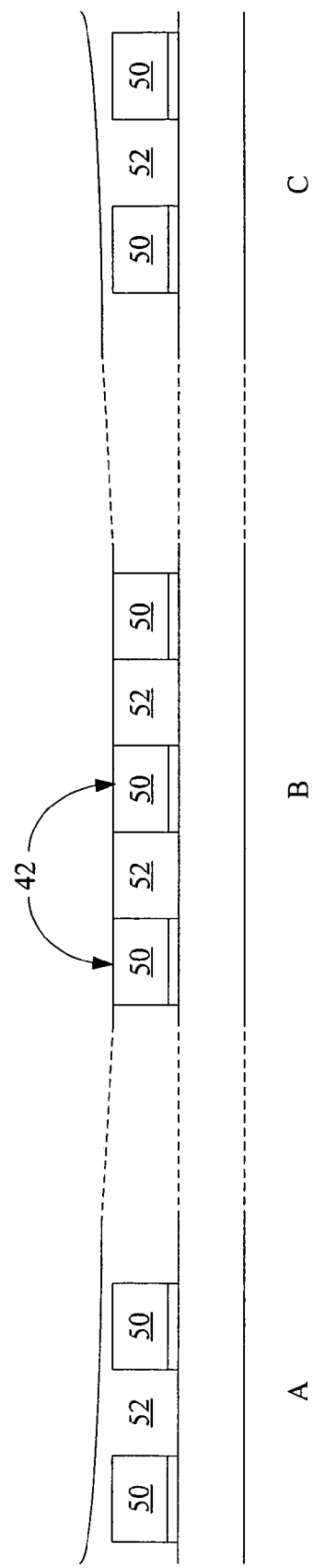

In the present example, the top of bottom conductor 42 is tungsten layer 50. The etcher should be programmed to detect the first exposure of tungsten using standard optical endpoint detection techniques. As soon as a byproduct of tungsten is detected, the etch is stopped by cutting plasma power or by stopping and evacuating gases, or both; the etch is stopped nearly instantaneously. FIG. 6*c* shows a cross-section of different sections of the wafer at this point. Section A is at one edge, section B is near the middle of the wafer, and section C as at the other edge. It is common for deposition rates to vary across a wafer, and it will be seen that at this point in the etch, tungsten has been exposed only at the center of the wafer, and not yet at the edges.

If a conventional oxide etch were to be continued at this point, it would etch oxide faster than the tungsten exposed at the center of the wafer. Thus by the time tungsten was exposed at the edges of the wafer, the oxide 52 between conductors 42 at the center of the wafer would be recessed as in FIG. 3.

Figure 6D:
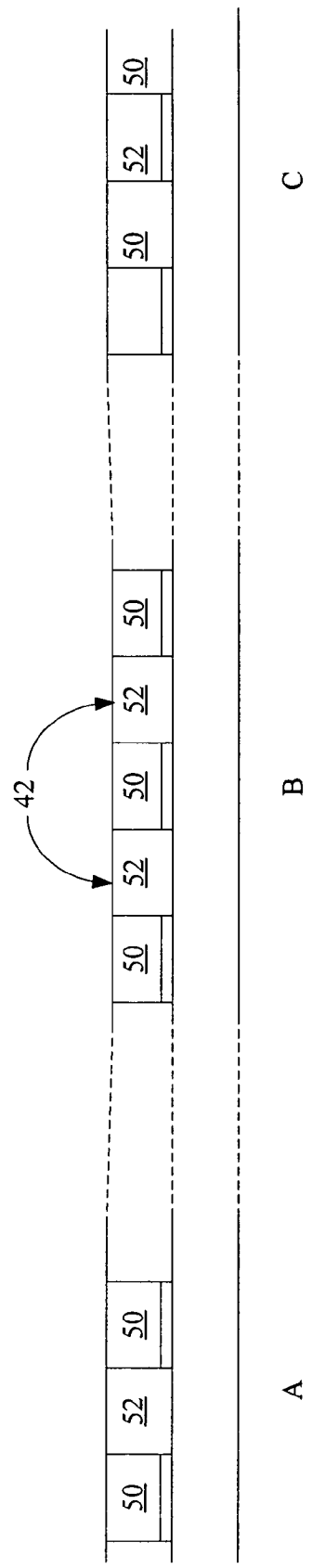

Instead, the second stage of the etch begins. In this example, the pressure for this etch is 200 mTorr. The flow of Ar is reduced to 60 sccm, while the flow of $SF_6$ is increased to 50 sccm; the plasma power and other flows are as before. It is desirable during this stage of the etch for the etch rates of tungsten and oxide to be as similar as possible. The second stage of the etch continues until tungsten is exposed across the wafer, for example for between about 3 and about 10 seconds, preferably between about 5 and about 6 seconds, most preferably about 5 seconds. A substantially planar surface is formed with first features and gap fill, and a minimal or no vertical step between them, as shown in FIG. 6*d*.

Figure 7A:
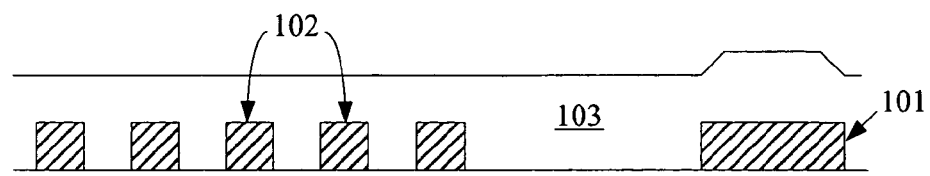
FIGS. 7a-7d are cross-sectional views illustrating topography formed over larger features during dielectric gap fill.
Figure 7B:
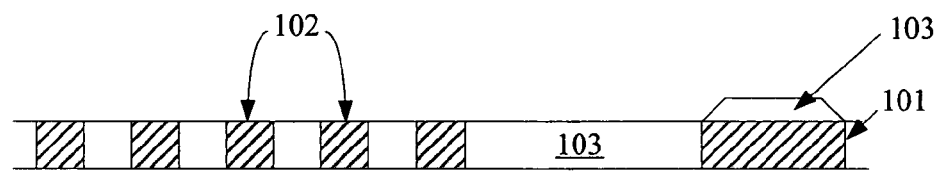

In embodiments of the '470 application, there are other features formed in the same patterning and etch step in addition to the conductors, which may serve as contacts for vertical interconnects. As shown in FIG. 7*a*, these features can be called landing pads 101, are larger than the rails 102, and generally have a larger gap between them and the closest feature. As a result, at the point at which the self-planarizing gap fill, for example HDP oxide layer 103, has become substantially planar over the dense conductors 102, substantial topography will still remain over landing pad 101. Recall that the etchback process just described largely maintains topography; a planar surface remains planar. Similarly, non-planarity will be maintained, and at the point at shown in FIG. 7*b* at which the two-stage etch just described has exposed the rails 102 across the wafer, some HDP oxide 103 still remains on landing pad 101.

In a subsequent step described in a following section, polysilicon will be deposited over HDP oxide layer 103, then patterned and etched to formed polysilicon pillars, each in contact with a rail 102. (In this description the term "polysilicon" will be used to describe polycrystalline silicon.) During the etch, the polysilicon will also be removed over the landing pad 101, then landing pad 103 will be covered with another oxide. The oxide will then be etched to form a void in which a vertical interconnect is formed to provide electrical connectivity between memory levels.

Figure 7C:
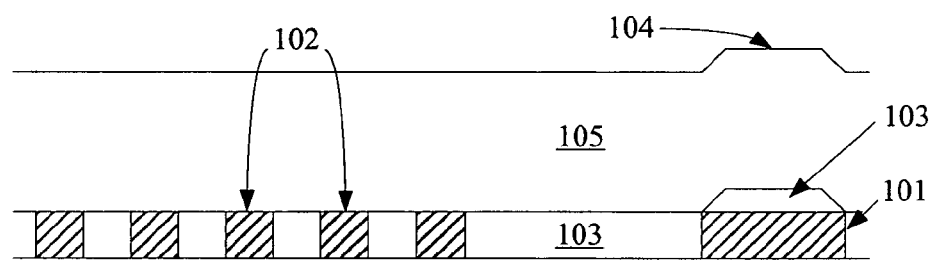

Polysilicon is generally highly conformal, and, as shown in FIG. 7*c*, after deposition of polysilicon layer 105 over rails 102 and landing pad 101, the topography over landing pad 101 will be preserved as a high area 104 in polysilicon layer 105. During exposure of photoresist, optimal resolution can be achieved only within a limited depth of focus; thus this remaining topography can compromise the quality of the exposure. It may therefore be advantageous to remove the remaining oxide 103 over landing pad 101 before depositing polysilicon layer 105. In some embodiments, this can be done with by performing a brief chemical mechanical polishing step with a soft pad. Chemical mechanical planarization is typically performed with a rigid pad made of polyurethane, and serves to planarize a surface. A related process is chemical mechanical polishing, which is performed with a soft pad and which smoothes or buffs features instead. Polishing with a soft pad also removes material, but removes less material than planarization with a rigid pad. A soft pad for polishing or buffing is available under the trade name Politex. Material will preferentially be removed on raised areas; thus the excess oxide over landing pad 101 can be removed while removing almost no further tungsten of rails 102 or the gap fill between them.

Figure 7D:
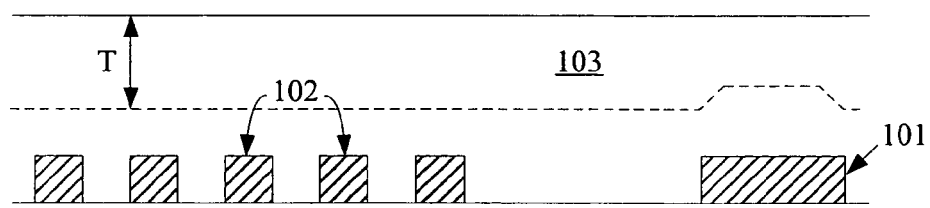

An alternative is shown in FIG. 7*d*. If, during deposition of HDP oxide 103 over rails 102 and landing pad 101, oxide 103 deposition is continued past the point at which HDP oxide 103 is substantially planar over the rails 102 for an additional thickness T as compared to the HDP oxide 103 thickness shown in FIG. 7*a*, eventually it will become substantially planar over landing pad 101 as well.

A specific example for the second stage etch has been provided, but many options are possible. Many details of process conditions could be changed; for example, the etch could be performed using some other fluorine-based chemistry, such as $NF_3$ instead of $SF_6$. The optimal conditions for this etch will be determined by balancing a variety of factors, including how much overetch is required, the size vertical step that can be tolerated, and the acceptable amount of tungsten loss.

Taking each of these factors in turn: the term "overetch" is used here to describe the etch performed after first detection of exposure of the buried features. It has been explained that at the instant of first exposure of the buried features, some portion of the buried features is exposed, while the rest is not yet exposed. A judgment must be made, based on the anticipated degree of nonuniformity of deposition of oxide across the wafer, how much additional oxide must be removed after first exposure to be certain that all buried features are exposed. For the device of the '470 application, 300-600 angstroms of overetch is generally appropriate.

In general, for the memory of the '470 application, a vertical step between the top surface of each conductor and the top surface of the adjacent vertical fill should be no more than about 500 angstroms. Preferably, the step is no more than about 300 angstroms.

The resistance of the conductors decreases with increased thickness, so it is desirable to limit loss of tungsten during overetch.

Figure 8A:
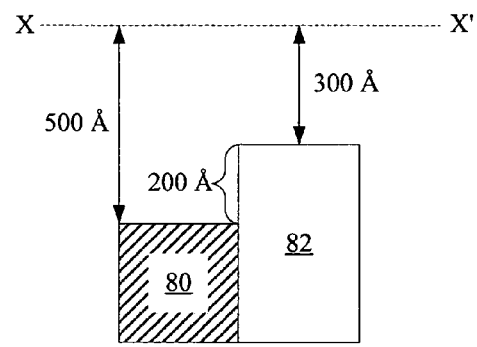
FIGS. 8a-8d are cross-sectional views illustrating results produced using different etch selectivities during a relatively nonselective oxide/tungsten etch.
Figure 8B:
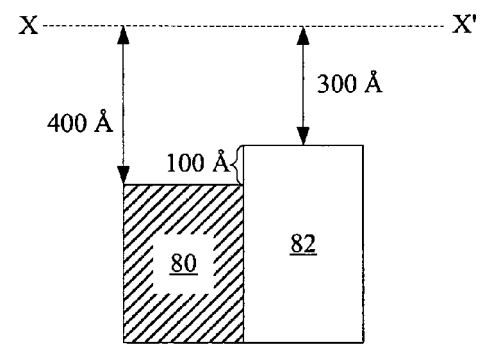

If the tungsten etches faster than the oxide, tungsten loss becomes the limiting factor. At one extreme, shown in FIG. 8a, a 300 angstrom oxide overetch starting at the surface X-X' at the time the tungsten is first exposed consumes 500 angstroms of tungsten 80 and 300 angstroms of oxide 82 and leaves a 200 angstrom step (the tungsten is recessed.) In this case the etch selectivity of oxide to tungsten is about 300:500, or about 0.6. A preferable, less selective etch, having an oxide:tungsten etch selectivity of, for example, about 0.75 is shown in FIG. 8b. In this case an overetch of 300 angstroms of oxide 82 removes 400 angstroms of tungsten 80, leaving a vertical step of 100 angstroms (the tungsten is recessed.)

Figure 8C:
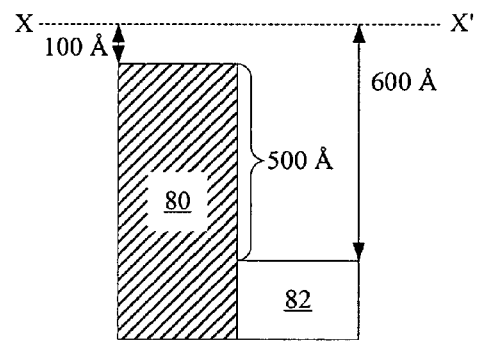

If, on the other hand, the oxide etches faster than the tungsten, the step size (depth of the oxide recess) becomes the limiting factor. FIG. 8c shows the case in which a 600 angstroms overetch of oxide 82 is performed and the maximum allowable 500 angstrom vertical step between the top surface of tungsten 80 and the top surface of the adjacent oxide 82 is created (oxide is recessed.) Thus 100 angstroms of tungsten 80 is etched, for etch selectivity of oxide to tungsten is about 600:100, or about 6.

Figure 8D:
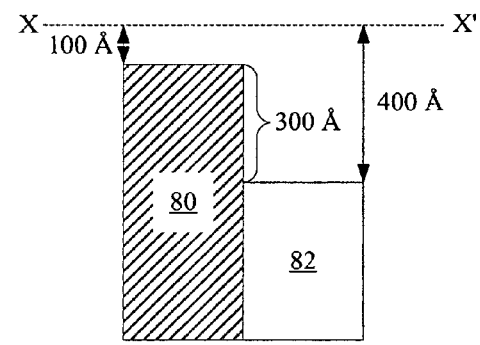

In preferred conditions, shown in FIG. 8d, a smaller vertical step of 300 angstroms is created (oxide recessed), while 100 angstroms of tungsten 80 is removed. In this case about 400 angstroms of oxide 82 and about 100 angstroms of tungsten 80 is removed, with an oxide:tungsten etch selectivity of about 4.

In short, it is preferable for the etch selectivity of oxide to tungsten to be between about 0.6 and about 6, and more preferably between about 0.75 and about 4.0.

To summarize, preferred embodiments of the present invention provide for a method for planarizing a wafer surface, the method comprising forming features of metal or a conductive alloy; depositing a dielectric material over and between the features; and substantially nonselectively etching both the dielectric material and a portion of the features to expose the features, wherein, during the nonselective etching step, the etch rate of dielectric to metal or the conductive alloy is between about 0.6 and about 6.

More specifically, this example described a planarized surface in a semiconductor device comprising a plurality of spaced-apart, substantially parallel rails of conductive material separated by gaps, each rail having a top surface; and a plurality of spaced-apart, substantially parallel strips of dielectric material filling the gaps, each strip having a top surface; and a covering material over and in contact with both the rails and the dielectric material, wherein a vertical step between the top surface of one of the rails and the top surface of the adjacent strip of dielectric material nowhere exceeds about 500 angstroms, and wherein no CMP step was performed on the conductive material after formation of the plurality of rails and the plurality of strips and before formation of the covering material. In preferred embodiments the covering material over and in contact with the rails and the dielectric material is more dielectric gap fill, as described in the following section.

EXAMPLE

Etch Oxide to Expose Deposited Silicon

Figure 6E:
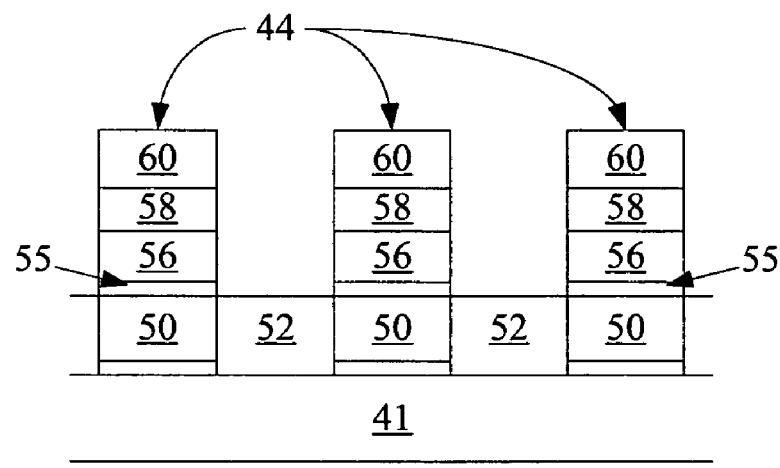

After the planarizing step just described, fabrication of the memory cell continues. Again referring to FIG. 5, if the barrier layer 55 wasn't deposited with bottom conductor 42, it is deposited on the surface just planarized, as shown in FIG. 6e. Silicon is deposited, with varied dopant types and levels to form a diode 44, as described in the '470 application. (Other semiconductor materials or semiconductor alloy, such as germanium, silicon-germanium, or gallium arsenide, for example, can be used instead.) In general, deposited silicon in situ doped with P-type dopants is polycrystalline as deposited, while deposited silicon which is undoped or doped with N-type dopants will be amorphous as deposited and will become polycrystalline after an subsequent anneal step. The silicon stack and the barrier layer are patterned and etched to form pillars 44. In this example, pillar 44 comprises heavily doped N-type polysilicon layer 56, undoped layer 58, and heavily doped P-type polysilicon layer 60. As more fully described in the '470 application, many other configurations are possible. The height of the pillar 44 after planarization is between about 2500 angstroms and about 3900 angstroms, preferably about 3200 angstroms. The thickness of heavily doped polysilicon layer 60 is between about 400 angstroms and about 800 angstroms, preferably about 600 angstroms. Note that in the '470 application, heavily doped layer polysilicon 60 is generally thicker as deposited to compensate for material that will be lost during CMP. Etchback does not remove as much material, so not as much sacrificial thickness need be deposited. In general about 1000 angstroms of silicon thickness may be lost to CMP, while in preferred embodiments about 300 to 500 angstroms of silicon is lost to a planarizing overetch.

Figure 6F:
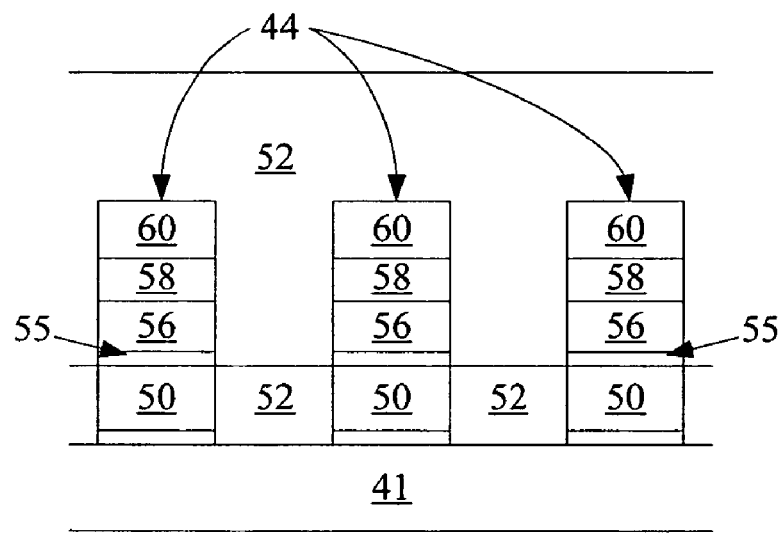

As shown in FIG. 6f, the gaps between pillars 44 are filled with dielectric 52, for example HDP oxide. The HDP oxide overfill must be removed and the tops of the pillars 44 exposed. The methods of the present invention can be employed to perform this etch.

As before, the self-planarizing dielectric 52, in this case HDP oxide, is overfilled to maximize planarity, for example to a thickness of between about 1500 and about 2500 angstroms, preferably about 2000 angstroms. Alternatively, in less preferred embodiments, dielectric material 52 can be non-planar as deposited, and planarized in a CMP step (not shown). The CMP step, if performed, is stopped before any portion of polysilicon layer 60 is exposed.

As in the previous example, a two-stage etch is employed. The first stage will remove the overfill of dielectric material 52 and expose the top surface of diodes 44. For example, if dielectric material 52 is HDP oxide, the etch is preferably performed in an appropriate chamber, for example an Applied Materials Centura MxP. In preferred embodiments, during the first stage etch, plasma power is about 800 watts, pressure is about 200 mTorr, and the following gases are flowed: about 40 sccm of $CHF_3$, about 20 sccm of $CF_4$, about 150 sccm of Ar, and about 10 sccm of N2.

Figure 6G:
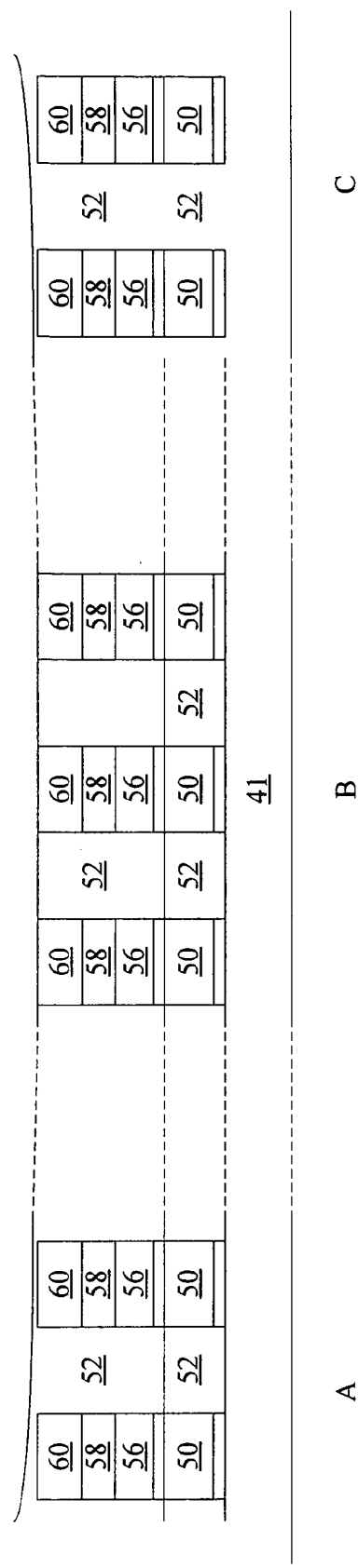

The etcher should be programmed to detect the first exposure of the top of diode 44, which is heavily doped polysilicon layer 60, using standard optical endpoint detection techniques. As soon as a byproduct of silicon is detected, the etch is stopped by cutting plasma power or by stopping and evacuating gases, or both; the etch is stopped nearly instantaneously. FIG. 6g shows a cross-section of different sections of the wafer at this point. Section A is at one edge, section B is near the middle of the wafer, and section C as at the other edge. It is common for deposition rates to vary across a wafer, and it will be seen that at this point in the etch, silicon has been exposed only at the center of the wafer, and not yet at the edges.

Figure 6H:
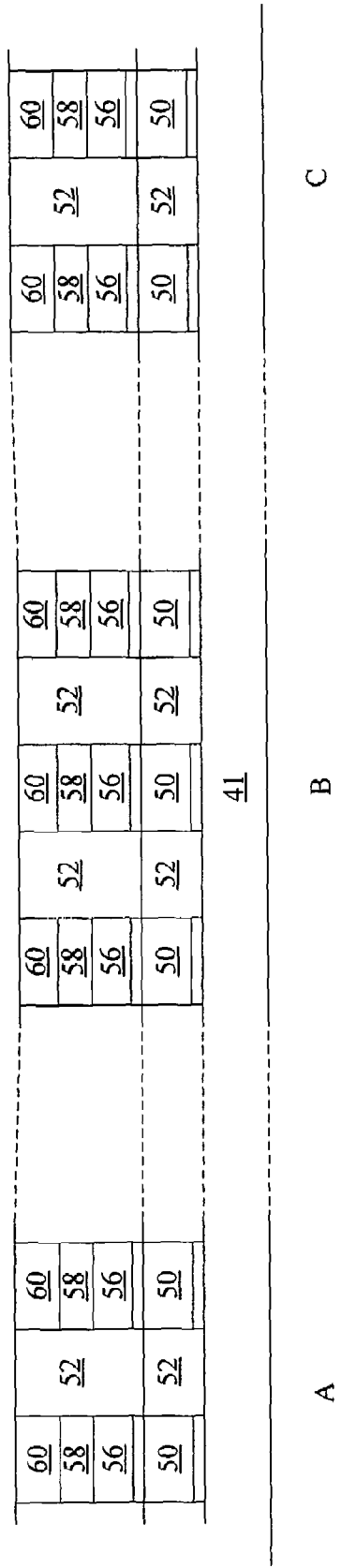

The second stage of the etch begins, and process conditions are changed. The plasma power is reduced to about 500 watts, and the pressure is unchanged at 200 mTorr. The flow of $CF_4$ is increased to about 50 sccm, and flows of $CHF_3$ and $N_2$ are stopped. It is desirable during this stage of the etch for the etch rates of silicon and oxide to be as similar as possible. The second stage of the etch continues until silicon is exposed across the wafer, for example for between about 3 and about 10 seconds, preferably between about 5 and 6 seconds, most preferably about 5 seconds. A substantially planar surface is formed with first features and gap fill, and minimal or no recess between them, as shown in FIG. 6h.

A specific example for the second stage etch has been provided, but many options are possible. Specifically, the change in process conditions between the first stage etch to the second stage etch could have been a change from fluorocarbon- to chlorine-based etch chemistries, or from fluorocarbon- to HBr-based etch chemistries. Many other variations will suggest themselves to those skilled in the art. The optimal conditions for this etch will be determined by balancing a variety of factors, including how much overetch is required, the size vertical step that can be tolerated, and the acceptable amount of polysilicon loss.

Based on the anticipated degree of nonuniformity of deposition of oxide across the wafer it is anticipated that an overetch of about 300 to about 600 angstroms after first exposure of polysilicon will ensure that all buried features are exposed.

In general, for the memory of the '470 application, a vertical step between the top surface of each pillar and the top surface of the adjacent vertical fill should be no more than about 500 angstroms. Preferably, the step is no more than about 300 angstroms. Another factor to be considered is that it is usual, in formation of the device of the '470 application, to subject the wafer to an HF dip after CMP and before formation of the antifuse to remove any native oxide that has formed on the exposed tops of the pillars. This HF dip typically removes about 200 angstroms of oxide. Thus a polysilicon recess produced by an unpatterned etch will be lessened by the HF dip, while an oxide recess will be increased.

It is preferred to limit the polysilicon loss to no more than about 1000 angstroms, and preferably no more than about 500 angstroms.

Turning to FIG. 9a, when polysilicon etches faster than oxide, in the case in which 1000 angstroms of polysilicon 84 is lost during an overetch of oxide 86 of 300 angstroms, a vertical step (polysilicon recess) of 700 angstroms will be created. The vertical step will be reduced to an acceptable 500 angstroms by the subsequent HF dip (shown in FIG. 9b.) In this case the etch selectivity of oxide to polysilicon is about 300 to about 1000, or about 0.3.

In a preferable, less selective etch shown in FIG. 9c, having an oxide:polysilicon etch selectivity of, for example, about 0.6, an overetch of 300 angstroms of oxide 86 removes 500 angstroms of polysilicon 84, leaving a vertical step of about 200 angstroms (the polysilicon is recessed) before the HF dip, and substantially no vertical step after the HF dip (in FIG. 9d.)

Figure 9E:
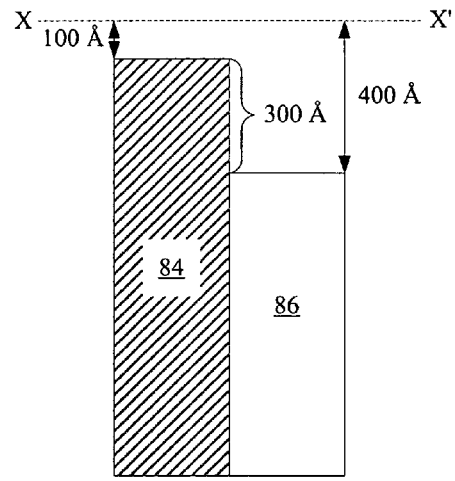
Figure 9F:
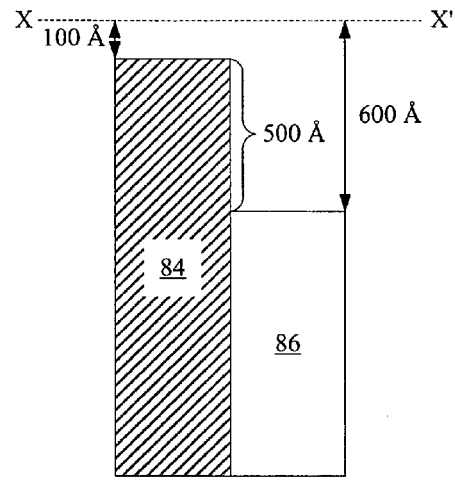

If, on the other hand, the oxide etches faster than the polysilicon, the step size (depth of the oxide recess) becomes the limiting factor. If the maximum allowable 500 angstrom vertical step is to be produced after the HF dip, then a 300 angstrom vertical step is the maximum allowable before the dip. Turning to FIG. 9e, about 400 angstroms of oxide 86 is etched along with about 100 angstroms of polysilicon 84 (oxide is recessed), for an etch selectivity of oxide to polysilicon of about 4. FIG. 9f shows the resulting 500 angstrom step after the HF dip removes another 200 angstroms of oxide.

Figure 9G:
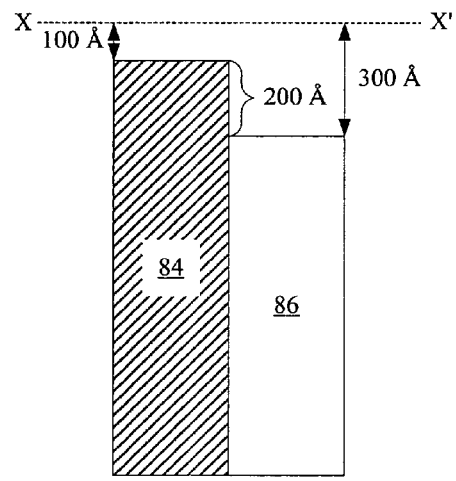
Figure 9H:
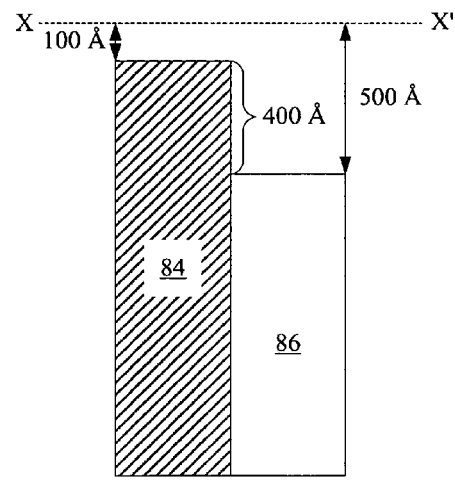

In preferred conditions, a smaller vertical step of 400 angstroms is created after the HF dip (oxide recessed), while 100 angstroms of polysilicon is removed. FIG. 9g shows this etch before the HF dip, with about 300 angstroms of oxide and about 100 angstroms of polysilicon is removed, at an oxide:tungsten etch selectivity of about 3. FIG. 9h shows the same etch after the HF dip removes another 200 angstroms of oxide.

In short, it is preferable for the etch selectivity of oxide to polysilicon to be between about 0.3 and about 4, and more preferably between about 0.6 and about 3.0.

In a subsequent step, a thin silicon dioxide antifuse will be grown on the silicon (shown as antifuse layer 45 in FIG. 5). The nonselective plasma etch may have caused some etch damage at the top of the silicon. Such damage will cause imperfections in the grown antifuse that may ultimately create leakage in the device. In preferred embodiments, conditions at the end of the nonselective etch may be modified to reduce etch damage. In one example, plasma power is reduced to 300 watts, pressure is 200 mTorr, flow of Ar is reduced to 100 sccm, and 50 sccm of $CF_4$ and 5 sccm of $SF_6$ are flowed.

The same method of finishing with a lower-power plasma etch could advantageously be used when etching any semiconductor surface that may be damaged in which such damage is harmful to device performance. A TFT polysilicon channel upon which a thin, high-quality gate oxide is to be grown, if exposed using the etchback methods of the present invention, might benefit from inclusion of such a step.

Another alternative to remove damage from the nonselective etch is to polish the surface using a soft Politex polishing pad. Preferably about 50 to about 300 angstroms of silicon is removed in this buffing step.

To summarize, then, embodiments of the present invention provide for a planarized wafer surface comprising a plurality of spaced-apart polysilicon diodes separated by gaps, the diodes having a first substantially planar top surface; a dielectric material filling the gaps, the dielectric material having a second substantially planar top surface; and a covering material on the polysilicon diodes and on and in contact with the dielectric material, wherein the vertical step between the top of the diodes and the top surface of the dielectric material nowhere exceeds about 500 angstroms, and wherein no CMP step was performed on the first planar top surface of the polysilicon diodes after formation of the plurality of diodes and the dielectric material and before formation of the covering material.

Examples have been given describing use of the etchback methods of the present invention at particular points in the fabrication of one type of monolithic three dimensional memory array. It will be understood, however, that the methods of the present invention could be used in any of monolithic three dimensional memory arrays mentioned earlier at any point in which a dielectric layer is removed to expose an active layer. Alternatively, the same features can be formed using a Damascene method, in which the dielectric material is deposited and patterned first, then is covered and filled with a conductive material. The conductive material can be etched to expose the dielectric features, then both nonselectively etched according to the methods described herein according to the present invention.

Further, it will be understood that an etchback to expose buried features according to the present invention could be used in formation of any memory or non-memory circuits, for example logic circuitry, where appropriate. For example, three dimensional logic circuitry might advantageously be formed using methods described herein.

Examples have been provided demonstrating use of the methods of the present invention in formation of a monolithic three dimensional memory array. It will be apparent, however, that these methods could be used to advantage in any semiconductor device when buried features are being exposed and planarity is important.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for exposing buried features on a wafer, the method comprising:
   forming the features comprising a first a) conducting or semiconducting material or b) insulating material;
   depositing a second a) insulating material or b) conducting or semiconducting material to cover the first material, the insulating or conducting property of the second material opposite the first material; and
   substantially nonselectively etching both the second material and the first material in the absence of a mechanical component, wherein etch selectivity of the second material to the first material during this nonselective etching step is between about 0.3 and 6.

2. The method of claim 1 wherein the first material is conducting and the second material is insulating.

3. The method of claim 2 wherein the first material is a conductive alloy.

4. The method of claim 2 wherein the first material is a metal.

5. The method of claim 4 wherein the metal is tungsten.

6. The method of claim 5 wherein etch selectivity of the second material to the first material during this nonselective etching step is between about 0.6 and 6.

7. The method of claim 6 wherein etch selectivity of the second material to the first material during this nonselective etching step is between about 0.75 and 4.

8. The method of claim 2 wherein the first material is a semiconductor.

9. The method of claim 8 wherein the first material is silicon.

10. The method of claim 9 wherein the silicon is polycrystalline or amorphous.

11. The method of claim 8 wherein the first material comprises germanium.

12. The method of claim 8 wherein the first material comprises a silicon-germanium alloy.

13. The method of claim 8 wherein the first material comprises gallium arsenide.

14. The method of claim 8 wherein etch selectivity of the second material to the first material during this nonselective etching step is between about 0.3 and 4.

15. The method of claim 14 wherein etch selectivity of the second material to the first material during this nonselective etching step is between about 0.6 and 3.

16. The method of claim 2 further comprising, before the nonselective etching step, etching only the second material.

17. The method of claim 16 further comprising, before the nonselective etching step, detecting exposure of the first material.

18. The method of claim 17 further comprising, after the detecting step, changing process conditions to begin the nonselective etching step.

19. The method of claim 18 wherein changing process conditions comprises changing source gases.

20. The method of claim 1 wherein the second material is self-planarizing during the depositing step.

21. The method of claim 20 wherein the second material comprises HDP dielectric.

22. The method of claim 21 wherein the second material comprises HDP oxide.

23. The method of claim 20 wherein the second material comprises spin-on polymer.

24. The method of claim 20 wherein the second material comprises spin-on dielectric.

25. The method of claim 24 wherein the second material comprises spin-on glass.

26. The method of claim 20 wherein the depositing step comprises overfilling the dielectric material to maximize planarity.

27. The method of claim 1 further comprising, before the nonselective etching step, selectively etching the second material.

28. The method of claim 27 further comprising, before the nonselective etching step, detecting exposure of the first material.

29. The method of claim 28 further comprising, after the detecting step, changing process conditions to begin the nonselective etching step.

30. The method of claim 29 wherein changing process conditions comprises changing source gases.

31. The method of claim 1 wherein the method is used in formation of a memory array.

32. The method of claim 31 wherein the memory array is a monolithic three dimensional memory array.

33. The method of claim 1 wherein the method is used in formation of logic circuitry.

34. The method of claim 1 wherein the method is used in formation of a first device level formed at a first height above a substrate.

35. The method of claim 34 wherein the method is used in formation of at least a second device level formed at a second height above a substrate, the second height different from the first height.

36. The method of claim 1 wherein no CMP step is performed between the depositing step and the etching step.

37. The method of claim 1 wherein the first material is insulating and the second material is conducting.

38. The method of claim 1 wherein the buried features comprise a plurality of substantially parallel rails.

39. The method of claim 1 wherein the buried features comprise a plurality of vertically oriented pillars.

40. A method for planarizing a wafer surface, the method comprising:
forming silicon features;
depositing a dielectric material over and between the silicon features; and
substantially nonselectively etching both the dielectric material and a portion of the silicon features in the absence of a mechanical component to expose the silicon features,
wherein during the nonselective etch step, the etch selectivity of the dielectric material to silicon is between about 0.3 and about 4.

41. The method of claim 40 wherein the silicon is polysilicon.

42. The method of claim 41 wherein the silicon features comprise a plurality of pillars.

43. The method of claim 41 wherein the silicon features comprise a plurality of substantially parallel, substantially coplanar rails.

44. The method of claim 40 further comprising:
after the depositing step, selectively etching the dielectric material; and
detecting exposure of any portion of the silicon features by the selective etching step.

45. The method of claim 44 further comprising, after the detecting step, changing process conditions to begin the nonselective etching step.

46. The method of claim 45 wherein changing process conditions comprises changing source gases.

47. The method of claim 40 wherein the dielectric material is self-planarizing during the depositing step.

48. The method of claim 47 wherein the dielectric material comprises HDP dielectric.

49. The method of claim 48 wherein the dielectric material comprises HDP oxide.

50. The method of claim 47 wherein the dielectric material comprises spin-on polymer.

51. The method of claim 47 wherein the dielectric material comprises spin-on dielectric.

52. The method of claim 51 wherein the dielectric material comprises spin-on glass.

53. The method of claim 47 wherein the depositing step comprises overfilling the dielectric material to maximize planarity.

54. The method of claim 40 wherein the method is used in formation of a memory array.

55. The method of claim 54 wherein the memory array is a monolithic three dimensional memory array.

56. The method of claim 40 wherein the method is used in formation of a first device level formed at a first height above a substrate.

57. The method of claim 56 wherein the method is used in formation of a second device level formed at a second height above a substrate, the second height different from the first height.

58. The method of claim 40 wherein the nonselective etching step is unpatterned.

59. The method of claim 40 wherein during the nonselective etch step, the etch selectivity of the dielectric material to silicon is between about 0.6 and about 3.

60. A method for planarizing a wafer surface, the method comprising:
forming features of metal or a conductive alloy;
depositing a dielectric material over and between the features; and
substantially nonselectively etching both the dielectric material and a portion of the features in the absence of a mechanical component to expose the features,
wherein, during the nonselective etching step, the etch rate of dielectric to metal or the conductive alloy is between about 0.6 and about 6.

61. The method of claim 60 further comprising:
after the depositing step, selectively etching the dielectric material; and
detecting exposure of any portion of the metal or conductive alloy by the selective etching step.

62. The method of claim 61 further comprising, after the detecting step, changing process conditions to begin the nonselective etching step.

63. The method of claim 62 wherein changing process conditions comprises changing source gases.

64. The method of claim 62 wherein the metal or conductive alloy is tungsten.

65. The method of claim 62 wherein changing process conditions comprising introducing or increasing flow of a fluorine-containing gas.

66. The method of claim 65 wherein the fluorine-containing gas is SF6 or NF3.

67. The method of claim 62 wherein the metal or conductive alloy is titanium nitride.

68. The method of claim 67 wherein changing process conditions comprises introducing or increasing flow of a fluorine-containing gas.

69. The method of claim 68 wherein the fluorine-containing gas is SF6 or NF3.

70. The method of claim 60 wherein the method is used in formation of a memory array.

71. The method of claim 70 wherein the memory array is a monolithic three dimensional memory array.

72. The method of claim 60 wherein the method is used in formation of logic circuitry.

73. The method of claim 60 wherein the method is used in formation of a first device level formed at a first height above a substrate.

74. The method of claim 73 wherein the method is used in formation of a second device level formed at a second height above a substrate, the second height different from the first height.

75. The method of claim 60 wherein the nonselective etching step is unpatterned.

76. The method of claim 60 wherein, during the nonselective etching step, the etch rate of dielectric to metal or the conductive alloy is between about 0.75 and about 4.

77. The method of claim 60 wherein the features comprise a plurality of substantially parallel rails.

78. A method for planarizing a surface, the method comprising:
forming features of a conductive or semiconductive material;
covering the features with a dielectric material;
performing a first etch of the dielectric material, the first etch having first process conditions;
stopping the first etch substantially when the conductive or semiconductive material is first exposed; and performing a second etch of both the conductive or semiconductive material and the dielectric material, in the absence of a mechanical component, the second etch having second process conditions different from the first process conditions.

79. The method of claim 78 wherein the conductive or semiconductive material is a semiconductor.

80. The method of claim 79 wherein the semiconductor is silicon.

81. The method of claim 80 wherein the second process conditions comprise flowing more CF4 and less CHF3 than the first process conditions.

82. The methods of claim 80 wherein the second process conditions comprise reduced plasma power relative to the first process conditions.

83. The method of claim 78 wherein the conductive or semiconductive material is a metal or a conductive alloy.

84. The method of claim 83 wherein the conductive or semiconductive material comprises tungsten.

85. The method of claim 84 wherein the second process conditions comprises flowing more SF6 or NF3 than the first process conditions.

86. The method of claim 83 wherein the conductive or semiconductive material comprises titanium nitride.

87. The method of claim 78 wherein the dielectric material comprises an oxide.

88. The method of claim 87 wherein the oxide is silicon dioxide.

89. The method of claim 78 wherein the features comprise a plurality of substantially parallel rails.

90. The method of claim 78 wherein the features comprise a plurality of vertically oriented pillars.

91. The method of claim 78 wherein the method is used in formation of a memory level formed above a substrate in a monolithic three dimensional memory array.

* * * * *